United States Patent [19]

Ishii et al.

[11] Patent Number: 5,019,944
[45] Date of Patent: May 28, 1991

[54] MOUNTING SUBSTRATE AND ITS PRODUCTION METHOD, AND PRINTED WIRING BOARD HAVING CONNECTOR FUNCTION AND ITS CONNECTION METHOD

[75] Inventors: Masahito Ishii, Hino; Tatsuo Kataoka, Kawaguchi; Yoshitaka Tanaka, Urawa, all of Japan

[73] Assignee: Mitsui Mining & Smelting Co., Ltd., Nihombashi, Japan

[21] Appl. No.: 357,030

[22] Filed: May 25, 1989

[30] Foreign Application Priority Data

Aug. 31, 1988 [JP] Japan .................. 63-215020
Sep. 9, 1988 [JP] Japan .................. 63-224714
Feb. 28, 1989 [JP] Japan .................. 1-45111

[51] Int. Cl.⁵ .................................................. H05K 1/00
[52] U.S. Cl. ......................... 361/400; 361/405; 361/406; 361/408; 174/259; 174/260
[58] Field of Search ............... 174/260, 259; 361/400, 361/408, 405, 406

[56] References Cited

U.S. PATENT DOCUMENTS

| 4,075,420 | 2/1978 | Walton | 174/259 |
| 4,368,281 | 1/1983 | Brummett | 174/259 |
| 4,694,572 | 9/1987 | Leber et al. | 174/259 |
| 4,774,634 | 9/1988 | Tate et al. | 361/400 |
| 4,818,823 | 4/1989 | Bradley | 361/400 |

*Primary Examiner*—Leo P. Picard
*Assistant Examiner*—Trinidad Korka
*Attorney, Agent, or Firm*—Bucknam and Archer

[57] ABSTRACT

This invention relates to a mounting substrate onto which components such as an IC chip are to be mounted, its production method, and a printed wiring board having a connector function suitable for a fine pitch and its connection method. Metal nodules are formed on conductors of connection portions by electrodeposition, or the like. Connection is made by fixing connection portions by an adhesive. Good conduction can be secured through the metal nodules and good insulation can be held between adjacent conductors.

15 Claims, 11 Drawing Sheets

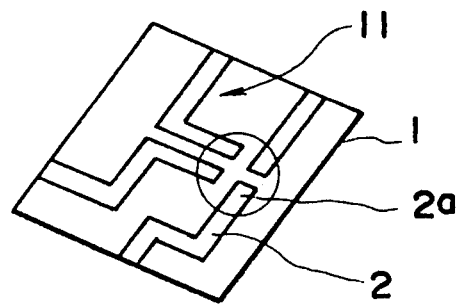
F I G. 4(a)
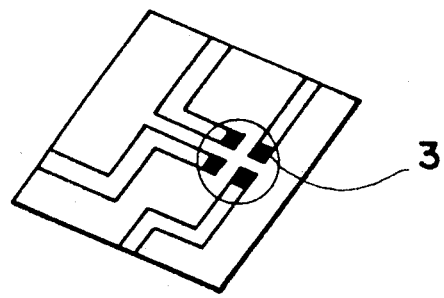
F I G. 4(b)
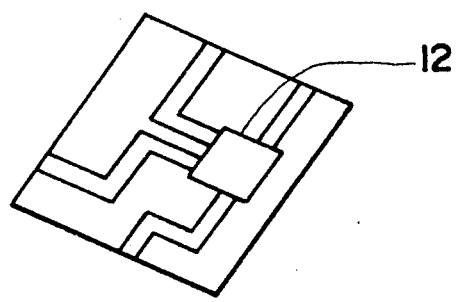
F I G. 4(c)

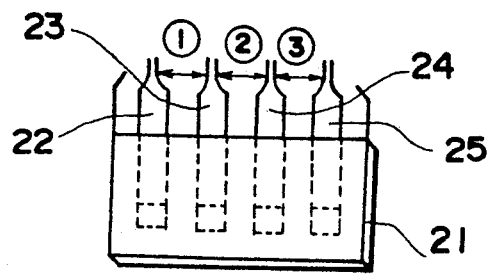
F I G. 10 (a)
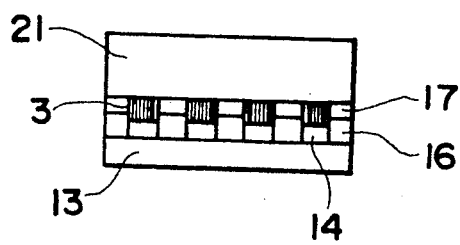
F I G. 10 (b)
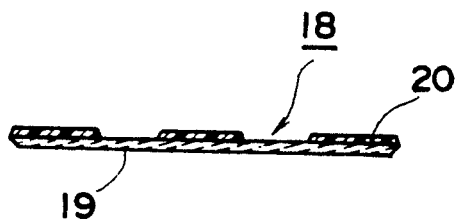
F I G. 11

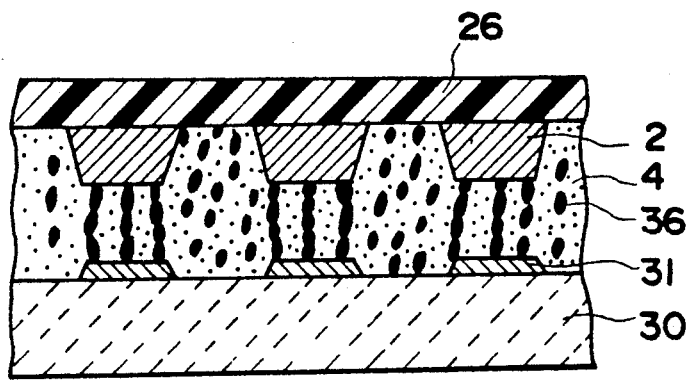
F I G. 19
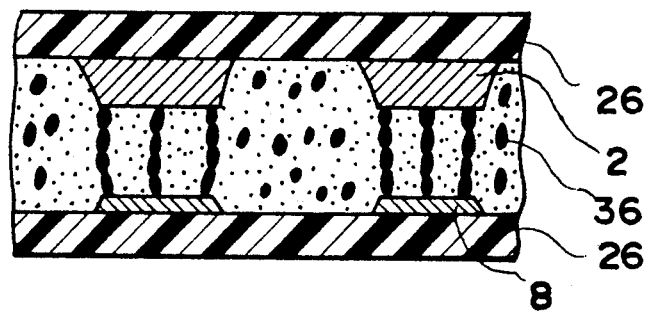
F I G. 20(b)
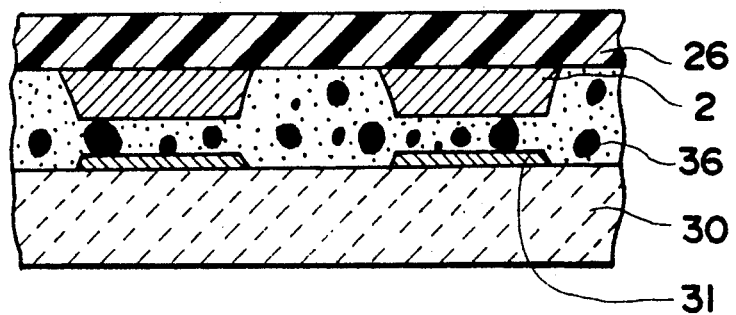
F I G. 20(a)

MOUNTING SUBSTRATE AND ITS PRODUCTION METHOD, AND PRINTED WIRING BOARD HAVING CONNECTOR FUNCTION AND ITS CONNECTION METHOD

BACKGROUND OF THE INVENTION

1. Field of the Invention

This invention relates to a mounting substrate on which components to be mounted such as an IC chip are mounted and its production method. More particularly, the present invention relates to a mounting substrate which is simple and economical but has a diversified application range and its production method wherein the components to be mounted onto the substrate are bonded by use of an adhesive and thereby being connected electrically to the substrate circuit through metal nodules formed on conductors of the substrate circuit.

Furthermore, the present invention relates to a printed wiring board equipped with connector portions (connection terminal portions) suitable for a fine pitch and having a connector function, and more particularly to a printed wiring board having a connector function and its connection method wherein the substrate is brought into contact with a counter-part conductor through the same metal nodules as mentioned above formed on the conductor of the connection terminal portions and by fixing it by an adhesive, and can thus make connection with an extremely small connection resistance and excellent insulation between adjacent conductors.

2. Description of the Prior Art

When a circuit substrate for surface mounting of IC package such as a flat package (DIP) or a tape carrier is produced, tin-lead electro-plating has conventionally been employed primarily to the conductor pattern portions of the substrate to connect the outer leads of the package by soldering.

More definitely, a cover lay film or a solder resist ink is coated for insulation to the portions of a circuit substrate having a circuit pattern formed on a polyimide film by etching a laminated copper foil on a polyimide film, for example, except the portions of components to be mounted and the connector portions Next, an about 0.2 μm-thick gold is electro-plated onto the terminal patterns for the connection after a Ni (nickel) layer is electro-plated and then solder plating or rustproofing treatment is given to the pads where electrical components are mounted. After the component mounting portions are coated with a paste like cream solder by screen printing method, the components are mounted by use of a mounter and then soldering is accomplished by reflow heating (230° C. × 10 seconds) with far infrared rays in a tunnel type continuous furnace. After the components are thus mounted, the substrate is washed to remove the flux and there is thus obtained finally a mounting substrate.

On the other hand, methods of directly mounting of a bare IC chip can be broadly classified into a wire bonding method and a wireless bonding method.

The wire bonding method is a technology based on connecting the conductor pattern of the substrate to the electrode pads of the IC chip by bonding wires. Bonding of both ends of bonding wires to the IC chip and the substrate is generally conducted by a thermal press system using conjointly an ultrasonic wave.

The wire bonding method is generally used for mounting a bare IC chip to a glass substrate, a ceramic substrate or a glass-epoxy substrate. However, mounting to a flexible substrate is also made in some cases and in this case, the bare IC chip and other chip components are mounted separately from one another. In other words, the bare IC chip is first connected to the substrate by the wire bonding method and molded with a resin. Then, the other chip components are soldered as described above.

The wireless bonding method directly connects the IC chip to the substrate through bumps or the like without using the wires. It includes a flip chip system using the solder bumps, a tape automated bonding (TAB) system using Au bumps, a conductive paste (Ag-Pd) system using Au-plated copper bumps, a conductive rubber connector system, and the like.

More definitely, in the TAB system, about 15 μm-thick Au bumps are formed at the electrode portion of the bare IC chip and the electrode portions of the bare IC chip and finger portions on the film substrate are connected by thermal press through the Au bumps. A package is completed by molding the IC chip by a resin. To further mount this TAB onto a rigid substrate pattern, the outer leads of TAB and the circuit pattern of the substrate must be soldered to one another.

However, the method of the prior art example described above which mounts the IC package or the like by soldering needs an elongated process step as described above. Since reflow heating must be carried out at 230°–260° C. for a few seconds, a heat-resistant polyimide film or the like must be employed in the case of the flexible substrate and an economical material such as a polyester film cannot be used.

As to high density mounting, there is the limit due to the following factors.

Namely, a position error of about ±0.2 mm in coating the cover lay film or the solder resist ink and the smear of about ±0.2 mm of the adhesive or ink must be taken into consideration and accordingly, the gap between pads (terminals) must be at least about 0.8 mm. Since the cream solder is coated onto the pad, the pad width must be at least 250 μm. If a flat package whose pad gap is of a 0.5 mm pitch is used, the gap is only 250 μm even when the pad width is 250 μm so that the cream solder might swell out when coated and might cause a solder bridge after solder reflow.

On the other hand, the wire bonding method which directly mounts the bare IC chip involves the following various problems.

(1) Though the method is effective for the rigid substrate such as glass, glass epoxy and ceramic substrates, the method has not yet been established as ordinary technique for the application to flexible printed wiring substrates because there are many limitations to the substrate material, plating conditions, and so forth.

(2) Since connection is made for each bonding wire, a long period of time is necessary for mounting.

(3) The width of the conductor wire is limited to 100 μm or above from the aspects of the size of capillary used for thermal press and working property.

(4) Repair cannot be made easily if the IC chip is defective.

(5) The total thickness becomes great due to looping (curve) of the bonding wire such as the Au wire.

In contrast, the conventional wireless bonding method involves the following problems.

(1) Since the bumps and the beam leads must be provided, the cost of production is high.

(2) Repair cannot be made easily and if the IC chip is defective, the substrate must be discarded as a whole.

In the case of the TAB system, the following problems further add to the above.

(3) The electrode pads of the IC chip can be disposed only on the outer peripheral portions of the chip.

(4) The substrate is limited to a film-like substrate and its thickness and width are limited to 125–100 μm and 35–70 μm, respectively.

(5) The heating temperature at the time of bonding is high, e.g. 400° C. for 2 to 5 seconds.

(6) The overall size becomes great when the outer leads are used.

Next, the printed wiring board will be described. Conventionally, when lead wires are taken out from a rigid printed wiring board such as a glass epoxy, paper phenol, transparent electrode glass substrate, ceramic circuit board or metal circuit plate by a flexible printed wiring board, a connection method which connects by soldering or a film-like or sheet-like anisotropic conductor film has most generally been employed.

The anisotropic conductor film is prepared by dispersing conductive particles such as metal powder, plating powder or carbon particles in a hot melt type or heat curing type adhesive and is used after shaped in a film or sheet form or as a liquid. As shown in FIG. 19, for example, when the anisotropic conductor film (or sheet) described above is sandwiched and thermally pressed between a glass substrate 30 having a circuit pattern of a conductor 31 such as ITO (Indium Tin Oxide) film and a polyimide film 26 having formed thereon a circuit pattern of a conductor 2 such as copper, the conductive particles 36 adhere closely because the gap between conductors 31 and 2 becomes small and the conductors 31 and 2 become conductive. Conduction is provided in the direction of thickness while insulation is provided in the planar direction.

However, both the method which uses soldering and the method which uses the anisotropic conductor film should be used when the pitch length between conductors is great, e.g. at least 0.2 mm. If the pitch is smaller than this value, short-circuit will occur between the adjacent conductors and even if it does not occur, insulation between the conductors becomes extremely inferior.

The anisotropic conductor film will be now discussed. As shown in FIGS. 20(a) and (b), insulation drops because the conductive particles exist even between the adjacent circuit patterns (gap portions) and as shown in (a), there is the variance of particle diameters between the conductive particles. Furthermore, since conduction is established by the mutual contact of the conductive particles as shown in (b), contact resistance is great whereas reliability is low. Though the hot melt type adhesive is generally used as the adhesive for forming the anisotropic conductor film, the cost of the conductive particles is by many times higher than the cost of the adhesive alone and the cost of the anisotropic conductor film is therefore high. Still other problems are that the kind of the adhesive used is limited by compatibility with the conductive particles and since the conductive particles are mixed, the bonding power drops than when the adhesive alone is used.

In view of the drawbacks of the prior art described above, it is an object of the present invention to provide a mounting substrate and a production method thereof wherein mounting components inclusive of a bare IC chip are mounted easily and in a high mounting density by a simple process and by use of an economical material.

It is another object of the present invention to provide a printed wiring board having a connector function which has high insulation between adjacent conductors, has an extremely low contact resistance and moreover, can be used for an independent circuit pattern from which leads cannot be extended, and a connection method of such a printed wiring board.

SUMMARY OF THE INVENTION

To accomplish the objects described above, in the present invention, metal nodules are formed on the conductor of connection terminal portions of a circuit of a substrate or printed wiring board, the connection terminal portions are fixed to mounting components or a printed circuit board by an adhesive and they are connected electrically through the metal nodules.

The metal nodules are formed by electrodeposition or non-electrolytic plating under a predetermined condition which generates needle-like or lump-like metal nodules.

Preferably, bonding of the substrate circuit or the printed wiring board and the mounting component or the printed circuit board is carried out by coating predetermined portions with a liquid adhesive or laminating a film-like adhesive to predetermined portions and then heating and pressing them or hot pressing them to bond them by use of this adhesive.

Before the metal nodules are formed, predetermined portions other than the portions which are connected electrically and the portions nearby may be coated and the nodules may be formed only at the portions which are not coated. In such a case, the mounting components can be bonded by applying the adhesive only to the connection portions.

In this construction, the metal nodules formed on the conductor break through the adhesive layer and come into contact with the counter-part conductor so that electrically excellent connection can be obtained. At the same time, the connection portions of both of them are fixed physically by the adhesive.

Thus, the present invention provides the following effects on the mounting substrate.

(1) Since bonding and connection of the components can be made by use of the adhesive, partial plating, coating and reflow of a cream solder and washing of flux are unnecessary and the process steps can be reduced. Since the adhesive covers simultaneously the circuit of the substrate, coating for insulation by use of a cover lay film or a solder resist becomes unnecessary, too.

(2) Since the solder reflow is not necessary, economical substrates such as a low heat-resistant polyester film, other film substrates, and the like, can be used. Even when a bare IC chip is mounted to a flexible printed wiring board, the present invention is free from the limitations in the prior art technique and can use all the substrates that are generally available. Therefore, selection freedom of the substrate materials can be improved.

(3) The present invention is free from those factors which would otherwise impede the fine pitch, such as a solder bridge and resist coating to prevent the former. Though the pitch has generally been 0.65 mm in the past (at times, minimum 0.55 mm but this is not general), the present invention can make mounting in the case of a circuit pattern having a minimum pitch by printing (300 to 400 μm), in principle. Furthermore, high density mounting with the adjacent conductor gap of about 100 μm can be made without the danger of short-circuit.

(4) The bare IC chip can be mounted directly to ordinary plastic film substrates and moreover, simultaneously with other mounting components. Moreover, mounting can be made without a large number of process steps that have been necessary in the wire bonding method and the TAB system.

(5) Since bumps or the like are not necessary for connection, there is no limitation to the IC chip to be mounted and the mounting cost is low.

(6) Even if the mounting component is found defective, repair can be made easily by dissolving the adhesive by a solvent.

(7) Mounting can be made without need of high temperature by use of a UV cure type adhesive or an α-cyanoacrylate adhesive. Heating may be at 180° C. for about 10 seconds even when a hot melt type adhesive is used.

(8) The electrode pads of the IC chip or the like can all be connected at one time and mounting can be made within a short period.

(9) Connection and mounting can be made even when the electrode pads exist inside the IC chip.

In the printed wiring board having a connector function, electric conduction with a counter-part rigid circuit or glass electrodes equipped with ITO is established through the metal nodules formed uniformly over the entire surface, or part of, the conductor of the connection terminal portions. In consequence, extremely low connection resistance can be attained and insulation characteristic between the adjacent conductors can be improved. Furthermore, bonding strength can be improved due to the anchor effect of the metal nodules, and the invention can be used for an independent circuit pattern from which leads cannot be extended. Thus, the present invention can make connection suitable for a fine pitch with high reliability.

The above and other effects, features and advantages of the present invention will become more apparent from the following detailed description when it is connected with the accompanying drawings.

BRIEF DESCRIPTION OF THE DRAWINGS

FIGS. 4(a) to 4(c) are explanatory views useful for explaining the IC chip mounting method in accordance with the present invention;

FIGS. 10(a) and 10(b) are a front view and a plane view showing the IC chip mounted in Example 2;

FIG. 11 is an enlarged sectional view showing the pad portion of the IC chip used in Example 2;

FIG. 19 is a sectional view showing schematically part of the connection terminal portion of the wiring board using the anisotropic conductor film in accordance with the prior art example; and FIGS. 20(a) and 20(b) are schematic views showing the variance of conductive particles in the conventional example and the mode of conduction due to contact of conductive particles.

DESCRIPTION OF THE PREFERRED EMBODIMENTS:

Embodiment 1

Figure 1:
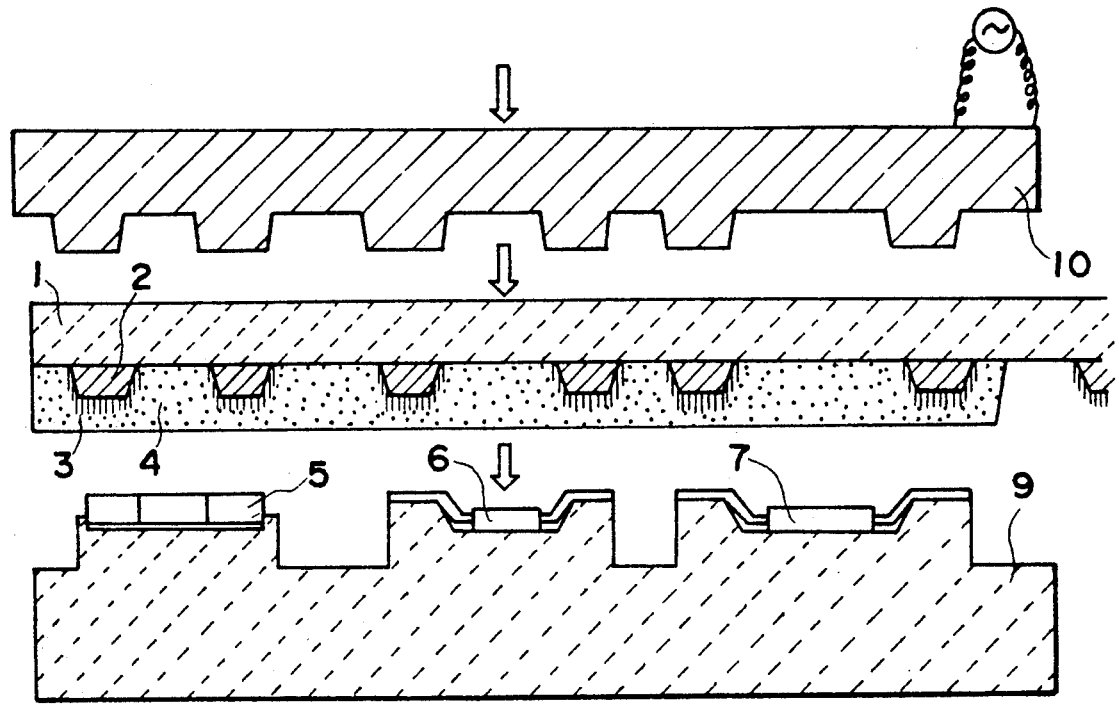
FIG. 1 is a schematic view showing typically a component mounting method in a production method of a mounting substrate in accordance with the present invention.
Figure 2:
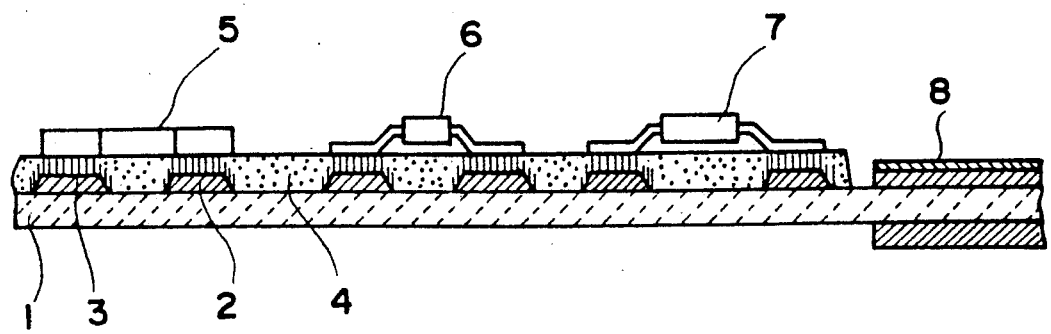
FIG. 2 is a sectional view showing typically the mounting substrate produced by the method of FIG. 1.

In a preferred embodiment of the present invention, as shown in FIG. 1, metal nodules 3 are formed on a conductor forming a circuit of a substrate 1 by electrodeposition and the circuit of the substrate 1 is covered by coating an adhesive 4 or by laminating a film-like adhesive 4. A chip resistor 5, DIP (Dual In-Line Package) 6, QFP 7, etc., are then bonded to the substrate 1 by the adhesive 4 and connected electrically to the conductor 2 forming the circuit of the substrate 1 through the metal nodules 3, providing thereby the mounting substrate such as shown in FIG. 2.

Here, it is possible to use any of a rigid printed wiring board, a flexible printed wiring board and a double-surface through-hole type substrate as the substrate 1. Polyester, polyimide, polyphenylene sulfide, ultra-thin glass epoxy, ceramic, glass, paper phenol, or the like, can be used as the material of the substrate 1. The circuit pattern of the conductor 2 is formed by printing of the pattern on one, or both, surfaces of the flexible or rigid substrate 1 by use of an electrically conductive paste such as carbon, Cu, Ag, or the like. It can be formed, too, by laminating copper, zinc, nickel, or the like, and then effecting exposure, development and etching, or by spattering.

Dendrites formed on the conductor 2 by electrodeposition are preferred as the metal nodules 3. Suitable examples of the dendrite material are metals such as copper, nickel, zinc, gold, silver and cobalt, and their alloys. It is possible to apply gold plating or platinum plating further onto these metal dendrite in a thickness of about 0.05 μm, for example, by field-less plating, and this is preferable in order to improve connection and adhesion with the counter-part conductor and to prevent rust. If the substrate has a connector portion 8 as shown in FIG. 2, this gold plating is applied to the entire surface inclusive of the connector portion 8.

The dendrite is formed by bump-plating in a suitable plating solution by use of the conductor 2 as the cathode by electrodeposition. The electrodeposition method can employ a specific electrodeposition condition referred to as "electrolytic copper powder process". In this case, electrolysis is carried out by use of a plating solution containing sulfuric acid of 100 g/l+10 g/l and having a copper concentration of 8 g/l at a current density of from 5 to 30 A/dm² for 3 to 10 minutes and electrolysis is then carried out further at 1 to 5 A/dm² for 1 to 10 minutes so that the metal nodules 3 consisting of fine copper particles having a grain diameter of 1 μm±0.1 μm and having a height of 10 μm±3 μm can be formed uniformly on the surface of the conductor 2. Here, if the current density is above 40 A/dm², copper will be deposited to the portions other than the conductor 2 and will result in undesirable shortcircuit.

The positions coated with the adhesive 4 extend to the area except the connector portion 8. If the adhesive is in the liquid form, it is left under the semi-cured state and if it is film-like, it is laminated by tentative bonding, or the like. A hot melt type adhesive, for example, is used as the adhesive 4.

Besides IC packages such as a 100-pin flat package having a 0.65 mm pitch or VSOP (Very Small Outline Package), bare IC chip itself can be used as the component to be mounted and can be mounted simultaneously. Bonding and connection of the mounting components are carried out by, for example, arranging the necessary mounting components onto an arrangement tray 9 as shown in FIG. 1, then pressing and heating the substrate by a heating tool 10 and melting the hot melt adhesive 4. When the bare IC chip is mounted, it is first bonded, and then a resin is bonded to seal the IC chip.

Figure 3:
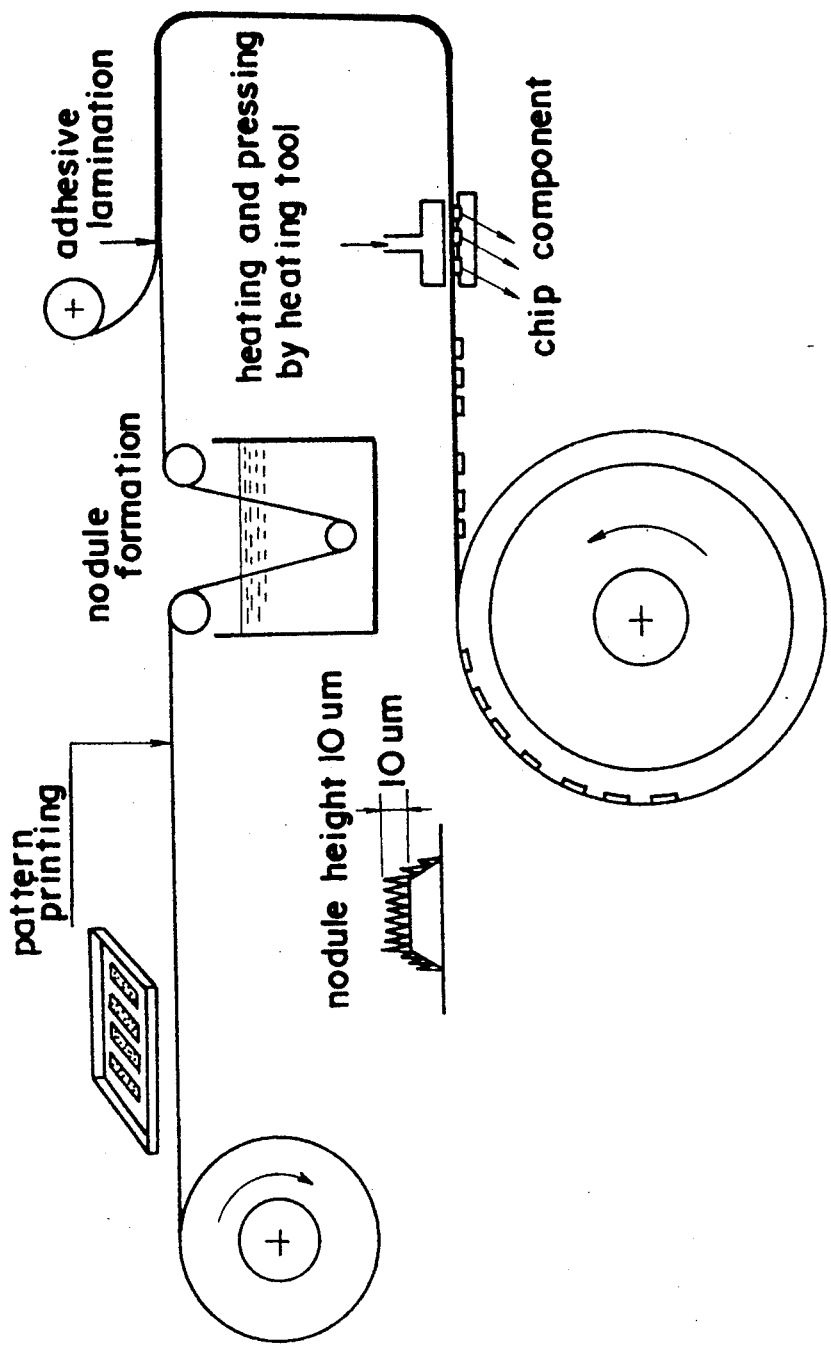
FIG. 3 is a schematic view showing typically the production steps when the production method of the invention is applied to a flexible substrate.

If the method of the present invention is applied to a flexible substrate, it includes the following steps (1) through (6) and can be carried out continuously, as shown partly in FIG. 3, for example:
(1) patterning to roll-like plastic film by printing;
(2) formation of nodules on the circuit pattern by electrodeposition;
(3) gold plating the entire surface;
(4) coating with the adhesive;
(5) mounting of components; and
(6) bonding and connection by heating and pressing.

In the construction described above, when the metal nodules 3 are formed and the mounting components such as the chip resistor 5 are bonded onto the substrate by heating and pressing after the adhesive 4 is coated or laminated, the metal nodules 3 formed at the connection pad portion of the conductor 2 break through the layer of the adhesive 4 and come into contact with the electrode portions of the mounting components and lead frame terminal portions. Accordingly, good connection can be established between the circuit of the substrate and the mounting components not only physically but also electrically. Here, the adhesive 4 at the portions where the components are not mounted is molten at the time of heating, cured by cooling and functions as a coating which protects the circuit pattern. Therefore, protection of the circuit pattern by a cover lay film or a solder resist is not necessary.

Unlike the conventional method, it is not necessary to mask the unnecessary portions when the metal nodules 3 are plated, and plating can be made on the entire surface inclusive of the connector portion 8. If the thickness of plating is not great, gold plating over the entire surface is more economical than partial plating.

If the hot melt type adhesive is used as the adhesive 4, bonding can be made for 10 seconds at 180° C. and for 15 seconds at 170° C. or in other words, bonding can be made by relatively low temperature heating. Therefore, PET (polyester film) or the like which has not been able to withstand the conventional temperature condition such as the heating at 230° C. for 10 seconds in the case of solder reflow can now be used as the substrate.

The metal nodules 3 can be formed in such a manner that they grow greatly on the upper surface of the conductor 2 but hardly grow on the side surfaces. Even when the gap between the conductors 2 is as small as about 10 μm, mounting can be made without the danger of short-circuit. Accordingly, it is not necessary to coat the cover lay film or the resist ink, that have been necessary conventionally, in order to prevent a solder bridge, and mounting can be made with the minimum pitch of the circuit pattern of the conductor 2 that can be formed by printing, e.g. 300 μm, as the pitch of mounting the components.

In accordance with the conventional TAB process or wire bonding process, various limitations are imposed on the material and thickness of the substrate, the kind of the adhesive for the laminate boards and their production methods, the plating method, and the like when the bare IC chip is mounted on the flexible printed wiring board. In accordance with the method of the present invention, however, mounting can be made to those substrates which are generally without these limitations.

Furthermore, since this method does not use cream solder, washing of flux is not necessary.

Embodiment 2

Figure 5:
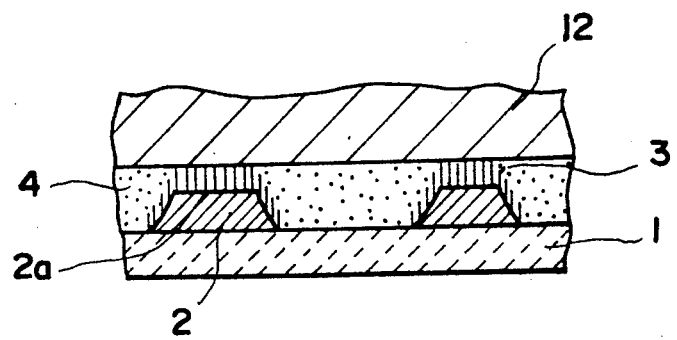
FIG. 5 is an enlarged sectional view showing the IC chip when it is mounted to the substrate by the method of the present invention.

In the second embodiment preferable for mounting the IC chip, needle-like or lump-like metal nodules 3 are formed by electrodeposition (FIG. 4(b)) on the surface of the connection portion 2a (the portion of the conductor 2 inside the circle in the drawing) for the electrode pad on the conductor 2 forming the circuit 11 and the IC chip 12 is bonded to the substrate 1 by the adhesive (FIG. 4(c)) in order to mount the IC chip onto the substrate 1, on which the circuit 11 is formed, and to connect its electrode pad to the circuit 11, as shown in FIGS. 4(a) to 4(c). In this manner, connection is established between the conductor 2 of the substrate 1 and the electrode pad through the metal nodule 3 as shown in the enlarged view of FIG. 5.

The same circuit substrate described above can be used as the substrate 1.

The metal nodules are formed by electrodeposition in the same way as described above but they may be formed only at the connection portions 2a. Therefore, the portions other than the electrodeposition portions are covered with resist printing or cover film before electrodeposition treatment.

Bonding between the IC chip 12 and the substrate 1 is made by use of a UV cure adhesive, an o-cyanoacrylate type adhesive such as "Aron Alpha" (trade name) or a hot melt type adhesive (e.g a 15 μm-thick sheet-like adhesive). Namely, the adhesive is coated or disposed on the portions including the connection portion 2a of the substrate 1 and after the electrode pad of the IC chip 12 is located correctly to the connection portion 2a, the adhesive is cured by pressing it at 40 to 60 kg/cm$^2$, for example. When the UV cure adhesive is used, it is cured by effecting UV exposure for 2 minutes at 1,200 mJ/cm$^2$ under the pressing mentioned above. When "Aron Alpha" (trade name) is used, only pressing is necessary. In the case of the hot melt type adhesive, it is heated, for example, at 200° C. for 5 seconds under the said pressing.

In this construction, the electrode pads of the IC chip 12 are pressed by the metal nodules 3 such as the dendrites formed on the surface of the connection portions 2a of the conductor 2 so that the IC chip 12 gains good conduction through the metal nodules 3, connected to the circuit of the substrate 1 and mounted. In this instance, the process steps such as the formation of bumps, the connection of bonding wires, the high temperature process, etc., are not necessary and mounting can be made economically and speedily through simple process steps. In the same way as described above, it is possible to form the dendrites in such a manner as to grow greatly on the upper surface of the conductor 2 but to hardly grow on the side surfaces, and mounting can be made without the danger of short circuit even if the gap between the conductors 2 or between the electrode pads of the IC chip 12 is as small as about 100 μm pitch. Furthermore, the electrode pads of the IC chip 12 need not necessarily exist around the peripheral portions of the chip and even if they exist at the inner portions of the chip, cover treatment by the cover film or the like is made suitably, the formation position of the metal nodules 3 is controlled and correct connection is carried out.

When such a connection is carried out, a system has been employed conventionally which makes bonding by heating to about 180° C. and pressing to about 15 kg/cm$^2$ by use of an anisotropic conductive film containing conductive metal particles such as nickel particles or solder balls in a hot melt type adhesive as described above so as to attain electric conduction by the conductive metal particles interposed between both electrode portions. However, the anisotropic conductive film has a contact resistance as high as 0.5 Ω (0.1×3 mm) and the resistance tends to increase with the passage of time. The insulation resistance between the electrodes becomes small in the fine pitch and the density of the electrodes is maximum 5 to 6/mm in practice.

In accordance with the connection method of the present invention described above, however, the contact resistance is extremely small, i.e. 0.0001 Ω, when the copper electrodes are connected mutually (with the diameter of the contact portion being 0.8 mmφ) by use of the hot melt adhesive and high electrode density connection of 10 electrodes/mm is possible. If the electrode gap is 100 μm, the insulation resistance of the adjacent electrodes is at least 10$^{10}$Ω, does not change in the course of use for an extended period and has therefore high reliability.

Embodiment 3

Figure 6:
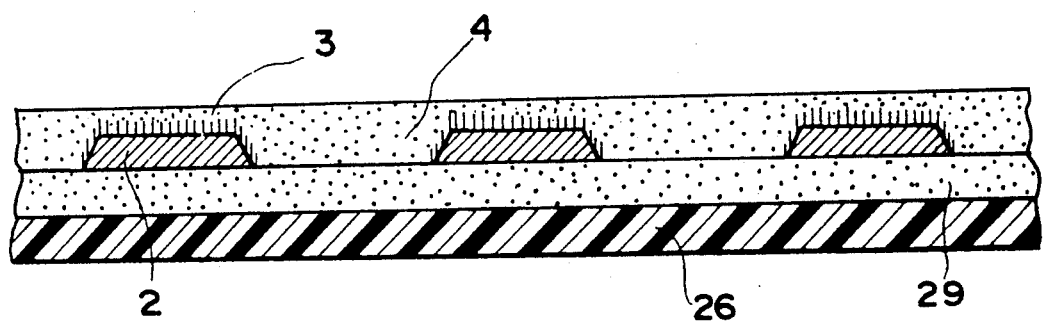
FIG. 6 is a sectional view showing typically part of the connection terminals of the printed wiring board of the present invention.
Figure 7:
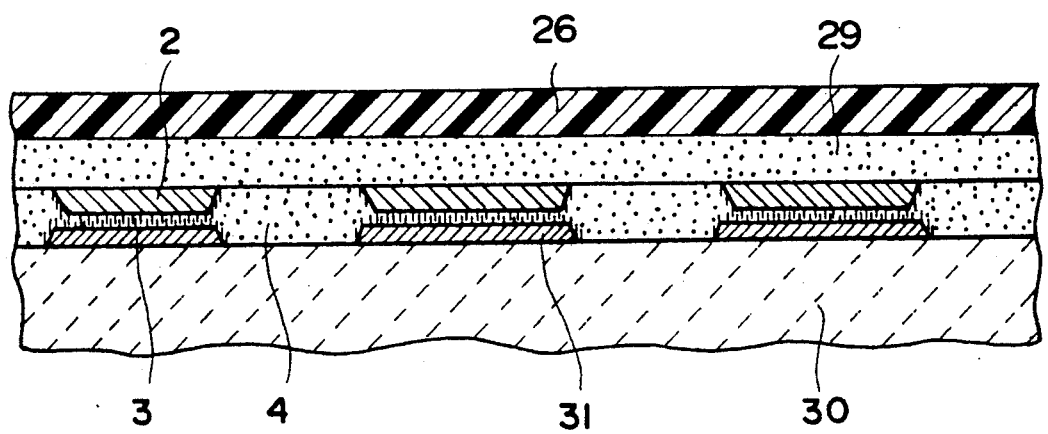
FIG. 7 is a sectional view showing typically and schematically part of the connection terminal portions when the printed wiring board of FIG. 6 is connected to a counter-part printed circuit board.

Preferred embodiment of the printed wiring board in accordance with the present invention are shown in FIGS. 6 and 7. In the drawings, reference numeral 26 represents a film or sheet-like film as the substrate of the printed wiring board; 2 is a conductor which is formed on the film 26 and constitutes a circuit pattern; 3 is a metal nodule formed on the conductor 2; and 4 is an adhesive packed into the gap region between the conductors 2 and between the metal nodules 3.

Though a polyimide film or cured adhesive can be used as the film 26, a rigid substrate may be used, too.

Copper, zinc, nickel, or the like, can be used as the material of the conductor 2. The circuit pattern is formed by laminating such a conductor material on one or both surfaces of the film 26 by the use of the adhesive 29 and etching the conductive material on the laminate film.

Needle-like or lump-like dendrites formed by use of the same material as those described above on the conductor 2 by electrodeposition are used as the metal nodules 3. However, the height of the metal nodules is preferably at least 0.1 μm and if it is too small, thermal pressing pressure is low and if the thickness of the adhesive is too great, contact gets inferior.

The dendrites are formed by oval plating in the same way as described above. The plating condition varies with the kind of the metal to be electrodeposited as the dendrite. In the case of the copper dendrites, for example, desired oval plating can be made by effecting electrolysis for a few minutes in a bath having a copper concentration of up to 5-10 g/l, at a current density of 3-10 A/dm$^2$ and at times, containing a trace amount of additive such as arsenic compound and β-naphthoquinoline. At this time, the dendrites grow greatly on the upper surface portion of the conductor 2 but hardly grow on its side surfaces, or bath composition and the plating condition are selected so as to attain such an object, the danger of short-circuit is extremely small even if the pitch gap between the conductors 2 is extremely small. This is the reason why connection of a fine pitch is possible and at the same time, is the greatest advantage. This method makes it possible to connect even at a pitch length (60 μm pitch) including 8 to 16 conductors/mm width without causing short-circuit and with high insulation property.

It is possible to use the hot melt type, the heat curing type or normally adhesive type adhesives as the adhesive 4. The adhesive 4 is packed to the thickness equal to, or lower than, the height of the metal nodules 3 within the range that does not greatly exceed the metal nodules 3. In other words, the thickness is preferably up to the total thickness of the thickness of the conductor such as the copper foil and the height of the metal nodule 3, and is normally and preferably from 10 to 35 μm. Even when the adhesive covers thinly the metal nodule 3 in the same way as in the case of the conductive paste or the anisotropic conductor film (or sheet) to which the metal powder is packed, or if the thickness of the adhesive is above the height of the metal nodule, good conduction can be established by pressing.

As shown in FIG. 7, the printed wiring board, in accordance with the present invention, is connected to a counter-part printed circuit board equipped with a glass substrate 30 and a circuit pattern formed on the former by a conductor 2 such as an ITO film, by bringing the connection terminal portions of both substrates into pressure contact and fixing them to each other by the use of the adhesive 4. The connection terminal portions of the printed wiring board is coated with the adhesive 4 or the adhesive sheet is sandwiched in between the connection terminal portions of both the substrates.

In comparison with the use of the conventional example using the conductive particles such as a metal or carbon powder as the conductor material such as shown in FIG. 19, the resistance in this embodiment is comparatively lower because the conduction is established through the metal nodule 3 as one metal mass and the insulating property, too, is extremely excellent because no conductor particle exists between the adjacent conductors. Thus, reliability can be improved. Moreover, since the metal nodules have concavo-convex surfaces and they are formed at the connection terminal portions, bonding strength can be greatly improved by the conjoint effect of the anchor effect with the adhesive and connection can be made with high reliability.

The most characterizing feature of this embodiment of the present invention lies in that it is suitable for connection of the fine pitch having conductor wires as many as 8 to 16 wires/mm, that has not been accomplished by use of the conventional anisotropic conductive film (or sheet), and the connection resistance is as low as $10^{-4}$ to $10^{-5}$ $\Omega$ which is comparatively lower than that of the conventional anisotropic conductor film or conductor paste. The flexible printed wiring board of the present invention is effective for the connection of a transparent electrode of a display device such as a liquid crystal television receiver for which a remarkable improvement in the fine pitch has been made recently and for the connection of an alumina head used in a printer or a facsimile whose dot number has been increased recently. It can also be utilized as a simple connector and can further be used for the connection with IC or the like.

Embodiment 4

In another preferred embodiment of the printed wiring board in accordance with the present invention, the metal nodules are formed by non-electrolytic plating. The materials of substrate, adhesive, metal nodules, and the like, that are used and the connection method are the same as those described already.

Figure 8:
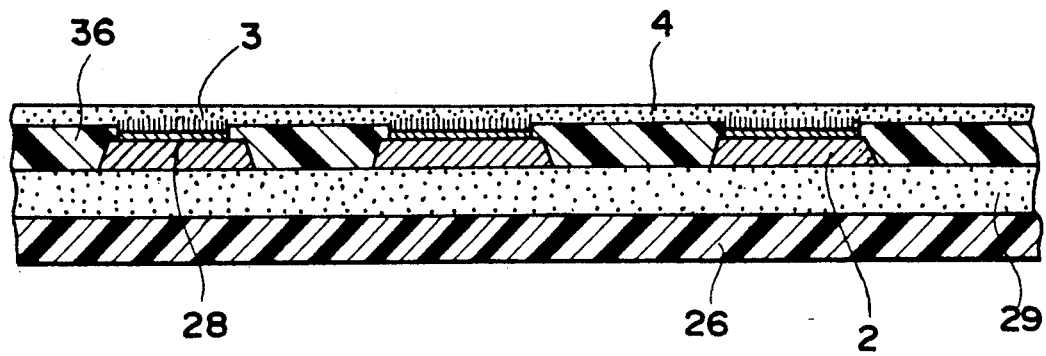
FIG. 8 is a sectional view similar to FIG. 6 when an insulation layer is disposed.

In the formation of the metal nodules by non-electrolytic plating, however, the nodules are formed not only in the direction of the height of the conductor but also in the direction of the width on the side surfaces of the conductor at the same ratio. If the gap between the adjacent conductors is small, therefore, short-circuit might occur. Accordingly, an insulator layer 36 is formed, in such a case as shown in FIG. 8 before the formation of the metal nodules in order to prevent the formation of the metal nodules on the side surface of the conductor.

The formation of the metal nodules is made by dipping the wiring board into a non-electrolytic plating bath under a predetermined condition for a necessary period of time, in which the crystals grow in the longitudinal direction, and at this time, the metal nodules 3 are formed uniformly over the entire surface of the conductor 2 and come to have an extremely uniform height. Accordingly, each metal nodule 3 can come into uniform contact with the conductor surface of the mating circuit and high reliability of connection can thus be obtained.

A cover lay film, a solder resist, a photo-cure type dry film, a photo-cure type liquid resist, and the like, can be used as the insulator layer 36.

When the metal nodule is formed in this manner by non-electrolytic plating, the same effect can be obtained as in the case of electrodeposition described above.

Next, preferred examples of each embodiment described above will be explained.

EXAMPLE 1

A circuit pattern whose conductor was 15 $\mu$m thick was formed by screen printing by use of a silver paste on a 25 $\mu$m-thick polyimide film substrate.

Next, electrodeposition was carried out for this circuit pattern in a plating bath containing sulfuric acid in a concentration of 100 g/l and copper in a concentration of 8 g/l at a current density of 30 A/dm$^2$ for 3 minutes and further at a current density of 5 A/dm$^2$ for one minute. In this manner the dendrites of copper were formed at a height of 10 $\mu$m.

A sheet-like adhesive of a hot melt type was heated at 150° C. for 5 seconds and pressed at a pressure of 10 kg/cm$^2$ for the purpose of tentative fixing of the adhesive onto the substrate including this circuit pattern.

Components to be mounted such as diodes, chip resistor, chip capacitor, bare IC chip, etc., were located and arranged at predetermined positions of the circuit pattern and the film substrate was heated from the back at 180° C. for 10 seconds simultaneously with pressing it at a pressure of 10 kg/cm$^2$. Thus, the components were bonded and connected.

Next, the following evaluation test were conducted for the resulting mounting substrate.

First of all, a load was applied to each mounted component in the perpendicular direction to the substrate to measure peel strength. As a result, it was found that each component did not peel off before the load of 2 kg is applied.

Then, thermal impact test by hot oil was conducted, wherein the substrate was heated for 10 seconds by silicone oil at 260° C., left standing for 20 seconds in air and dipped in trichlene for 20 seconds as one cycle. As a result, good connection resistance could be maintained till 20 cycles.

Furthermore, a thermal impact test by a thermal cycle consisting of cooling at $-65°$ C. for 30 minutes and heating at 125° C. for 30 minutes was conducted. As a result, good connection resistance could be maintained till 40 cycles.

EXAMPLE 2

Figure 9A:
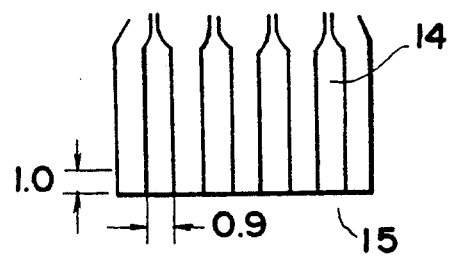
FIGS. 9(a) and 9(b) are a plane view and a front view showing part of the substrate used in Example 2.
Figure 9B:
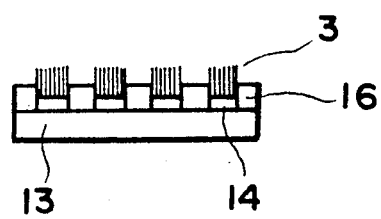

As shown in FIGS. 9(a) and (b), a substrate was first formed by laminating a 18 $\mu$m-thick electrolytic copper foil 14 on a 25 $\mu$m-thick polyester film 13 and by patterning (circuit formation) by etching. The substrate was then covered with a polyester cover film 16 (25 $\mu$m thick) in such a manner as to leave each connection portion 15 (0.9×1.0 mm) of the circuit at which metal nodules were to be formed. Electrodeposition was then conducted in a plating bath containing sulfuric acid in a concentration of 100 g/l and copper in a concentration of 8 g/l at a current density of 8 A/dm$^2$ for 5 minutes and further at a current density of 4 A/dm$^2$ for 5 minutes in order to grow copper dendrites at each connection portion 15 of the circuit. The metal nodules 3 were formed in such a manner as to project by about 10 $\mu$m from the upper surface of the cover film 16 described above and 0.05 μm gold plating was formed on the nodules 3 for rust-proofing.

Next, as shown in FIG. 10, a UV cure type adhesive 17 was coated to the portion including the connection portion 14 described above in order to mount a bare IC chip 21 having the following specification. Namely, the bare IC chip 21 had a chip size of 4.8×6.0 mm and pad portions 18 formed in a 400 μm pitch as the uninsulated portions (120 μm ×120 μm) of aluminum vapor deposition portions 19 not insulated by a 1 to 2 μm-thick passivation (liquid polyimide coating) 20 as shown in FIG. 11. After this bare IC chip 21 was located, the adhesive 17 was cured by UV exposure at 1,200 mJ/cm$^2$ for 2 minutes while pressing at a pressure of 50 kg/cm$^2$ so as to mount the bare IC chip 21.

Then, the resistance between each electrode 22-25 shown in FIG. 10(a) was measured with the proviso that the resistance value between each pad of the IC chip itself was about 0.3 Ω.

The procedures described above were carried out twice and the results are tabulated in Table 1 as No. 1 and No. 2 with symbols $R_1$, $R_2$ and $R_3$ representing the resistance values between the electrodes 22 and 23, between the electrodes 23 and 24 and between the electrodes 24 and 25, respectively.

TABLE 1

|  | adhesive | No. of times | conductor resistance (Ω) | | |
|---|---|---|---|---|---|
|  |  |  | $R_1$ | $R_2$ | $R_3$ |
| Example 2 | UV cure | No. 1 | 0.324 | 0.320 | 0.340 |
|  |  | No. 2 | 0.337 | 0.350 | 0.328 |
| Example 3 | α-cyano acrylate | No. 1 | 0.311 | 0.309 | 0.309 |
|  |  | No. 2 | 0.306 | 0.308 | 0.311 |
| Example 4 | hot melt | No. 1 | 0.306 | 0.305 | 0.304 |
|  |  | No. 2 | 0.304 | 0.307 | 0.306 |
|  |  | No. 3 | 0.305 | 0.306 | 0.305 |

EXAMPLE 3

Mounting of the bare IC chip and measurement of the resistance were conducted twice in the same way as in Example 2 except that an α-cyanoacrylate adhesive was used as the adhesive and was cured by only applying a pressure. The results are also tabulated in Table 1 above in the same way as Example 2.

EXAMPLE 4

Mounting of the bare IC chip and measurement of the resistance were conducted thrice in the same way as in Example 2 except that a hot melt adhesive was used as the adhesive and heating was made at 180° C. for 10 seconds under a pressure of 50 kg/cm$^2$. The results are also tabulated in Table 1 above in the same way as Example 2.

EXAMPLE 5

Mounting of the bare IC chip was conducted in the same way as in Example 2 except that a polyimide film and a polyimide cover film were used as the polyester film 13 and the polyester cover film 16, respectively, and a hot melt adhesive (sheet-like form having a thickness of 15 μm) was used as the adhesive and cured by heating at 180° C. for 10 seconds under a pressure of 50 kg/cm$^2$.

Next, the contact resistance between each electrode (between terminals) was measured as the change by each of the thermal test of 10 cycles, 20 cycles and 30 cycles each 1 cycle consisting of cooling at −65° C. for 30 minutes and heating at 125° C. for 30 minutes. The results are tabulated in Table 2 below.

TABLE 2

|  | conductor resistance (Ω) | | |
|---|---|---|---|
|  | $R_1$ | $R_2$ | $R_3$ |
| initial value | 0.306 | 0.305 | 0.305 |
| 10 cycles | 0.306 | 0.305 | 0.305 |
| 20 cycles | 0.307 | 0.306 | 0.306 |
| 30 cycles | 0.309 | 0.308 | 0.308 |

As can be understood from Tables 1 and 2, the mounting method of the present invention provides practically sufficient conduction and durability to cooling and heating is sufficient at least in the case where the hot melt type adhesive is used.

EXAMPLE 6

First of all, the copper surface of a flexible printed board (250 mm×330 mm) formed by laminating an 18 μm-thick copper foil on a 25 μm-thick polyimide film (capton) was cleaned, and a 25 μm-thick photo-sensitive dry film was then laminated. Exposure was effected through a negative film of a 125 μm pitch (gap 60 μm; conductor width 65 μm) so that 8 conductors per 1 mm were contained. Development was made by an alkaline solution and after the copper layer was etched by a ferric chloride solution, the resist of the dry film was peeled, thereby obtaining the wiring board having the pitch described above.

Next, after the exposed copper conductor was washed with an acid, electrolysis was conducted for about 8 minutes in an electrolytic bath containing copper in a concentration of 8 g/l, sulfuric acid in a concentration of 100 g/l and α-anthraquinoline in a concentration of 20 mg/l at a current density of 6 A/dm$^2$ so that 2 to 3 μm oval dendrites having high adhesion could be formed on the copper conductor.

Furthermore, gold plating in a thickness of about 0.5 μm was applied onto the dendrites in a neutral gold cyanide bath as was practiced generally in the art so as to insure rust-proofing of copper, to reduce the contact resistance and to improve fixability of the precipitate on the copper layer. A thermo-cure type epoxy adhesive was coated in a thickness of about 20 μm under a dry state onto this wiring board having this gold plating fine pattern by use of a roll coater, dried and then preserved at the "B-stage" as referred to in the field of the epoxy type adhesives.

Next, this wiring board was cut in a necessary size, located to the terminals of the rigid printed circuit board having likewise the 8/mm conductor pitch, pressed by a hot press at 180° C. and a pressure of 50 kg/cm$^2$ for 3 minutes thereby to connect. The connection resistance, the insulation between the wires and bonding power were measured. The results are shown in Table 3 below in comparison with the case of the conventional anisotropic conductor film (Comparative Example 1);

TABLE 3

|  | Comparative Example 1 | Example 6 |
|---|---|---|
| connection resistance | 2–10Ω | $10^{-4}$–$10^{-5}$Ω |
| insulation between wires | $10$–$10^8$Ω | $10^{10}$–$10^{12}$Ω |
| bonding power | 0.5 kg/cm | 1 kg/cm |

As can be seen from Table 3, the wiring board of this invention is superior to the conventional anisotropic conductor film in all the aspects of the connection resistance, the insulation between the wires and the bonding power. Whereas the short-circuits occur at several positions in the conventional anisotropic conductor film, the wiring board of the present invention is free from such short-circuits.

To clarify the reasons, the connection terminal portions of the conventional anisotropic conductor film and wiring board of the present invention were observed through an electron microscope, respectively. As a result, conductive powder dispersed in the adhesive was observed as black spots in the particle structure when the anisotropic conductor film was connected to glass and such black powder was also found existing in the gap between the conductors for which insulation was necessary. In contrast, in the particle structure of the wiring board when the dendrites were deposited in the present example, nothing that would impede insulation such as the conductor particles existed at all in the gap other than the conductors. It could be appreciated from this result that in the case of the wiring board of the present example, the short-circuit would not occur between the adjacent circuits even when the conductor gap was reduced. When the conductor portions where the dendrites were formed were further expanded, the dendrites were found to have been formed in a high density on the conductor surface. When the contact state of the dendrites with glass when the adhesive was packed and bonded to glass was observed from the glass surface side, the tips of the dendrites were confirmed to have been in touch reliably with the glass surface and reliable conduction could be established without losing conductivity.

EXAMPLE 7

A polyimide film substrate equipped with a ultra-thin copper layer was used as the starting material. This substrate was formed by laminating about 1 $\mu$m-thick copper on an about 25 $\mu$m-thick polyimide film and effecting non-electrolytic plating in a thickness of 9 $\mu$m in a copper sulfate bath to which a trace amount of glue was added. A liquid photoresist was coated on the laminated copper surface of the polyimide film substrate and exposure and development were conducted through a negative film pattern having 16 conductor wires per 1 mm width. Then, the copper layer was etched in the same way as in Example 6 and the resist was peeled to obtain a printed wiring board having an ultra-fine pitch. Next, the exposed copper conductor was washed with an acid and electrolysis was conducted in a weakly acidic electrolytic bath containing 10 g/l of nickel sulfate, 5 g/l of ammonium sulfate and 2 g/l of potassium bromide at a current density of 5 A/dm$^2$, a bath voltage of 6 V and a bath temperature of 40° C. for several minutes thereby to deposit black nickel dendrites.

Figure 12:
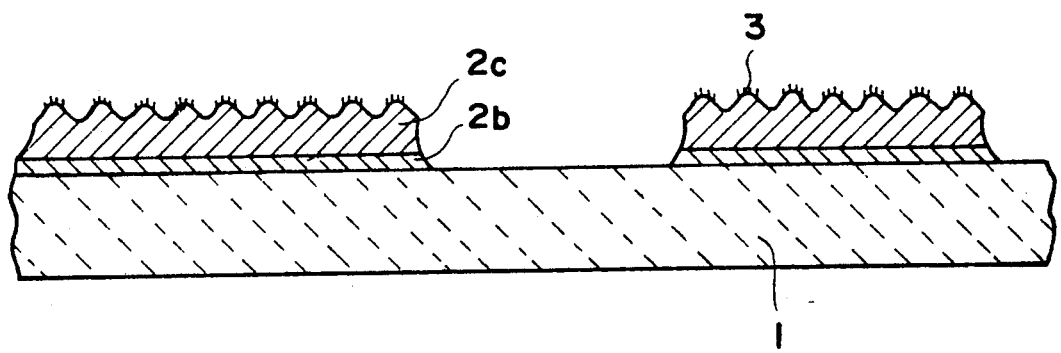
FIG. 12 is a sectional view showing typically and schematically part of the connection terminal portions of the printed wiring board having an ultrafine pitch which is obtained in Example 7.

FIG. 12 is a schematic sectional view showing part of the connection terminal portions of the resulting printed wiring board. When the surface of this printed wiring board was observed, it was confirmed that corrugations of several microns of a copper layer 2c formed by non-electrolytic plating on a spatter copper layer 2b in the copper sulfate both containing a trace amount of glue existed and dendrites 3 of nickel were deposited on this copper layer 2c as shown in the drawing. When the dendrite formation was conducted under different conditions of electrolysis and with different bath conditions, needle-like dendrites were formed.

Next, the hot melt type adhesive which was dissolved in a solvent was coated to the connection terminal portions of the wiring board after completion of the electrodeposition of the dendrites by screen printing and was then dried to evaporate the solvent so as to pack the adhesive to substantially the same height as that of the dendrites.

Figure 13:
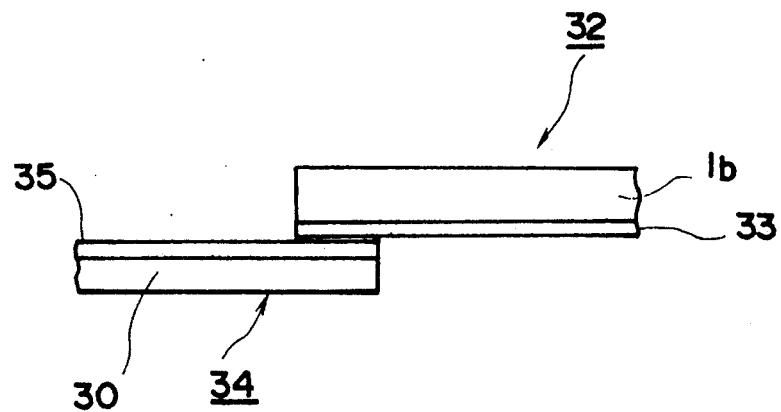
FIG. 13 is a side view showing schematically the printed wiring board of FIG. 12 when it is connected to another circuit board.

The connection terminal of the flexible printed wiring board of the ultra-fine pitch thus obtained and the ultrafine connection terminals of a rigid circuit board obtained by etching a transparent ITO film on a glass base were located, then pressed tentatively by a hot press at 80°–150° C. and a pressure of 10–20 kg/cm$^2$ for 3 seconds and then pressed finally at 150° C. for 10 seconds. FIG. 13 is a side view showing schematically the flexible printed wiring board and the rigid circuit board connected mutually in this manner. Reference numeral 32 represents the fine-pitch flexible wiring board; 33 is a copper conductor circuit formed by a copper layer on the polyimide film 1b; 34 is a transparent electrode substrate of the counter-part; and 35 is a circuit of the ITO film formed on the glass base 30.

Next, the conduction resistance between the terminal of the copper conductor circuit 33 of the flexible printed wiring board and the transparent electrode terminal of the ITO film circuit 35 of the transparent electrode substrate thus connected was measured. The resistance was found to be as small as $10^{-5}$ $\Omega$ and the insulation resistance between the adjacent conductors constituting the circuit 33 was from $10^{12}$ to $10^{13}$ $\Omega$. Thus connection having extremely high reliability was confirmed.

EXAMPLE 8

A flexible printed wiring board (250 mm × 330 mm) obtained by laminating an 18 $\mu$m-thick copper foil on a 25 $\mu$m-thick polyimide film ("Upirex") was prepared. After the copper surface of the substrate was cleaned, a 25 $\mu$m-thick photosensitive dry film was laminated and exposure was effected through a negative film having 125 $\mu$m pitch (gap 60 $\mu$m, conductor width 65 $\mu$m) so that 8 conductors were contained per mm. Development was then made by an alkaline solution and the copper layer was etched by a cupric chloride solution. The resist of the dry film was peeled and a fine-pitch wiring board was thus obtained.

Next, an insulation layer was formed at portions other than the connection terminal portions by use of a cover lay film by hot pressing.

Needle-like non-electrolytic plating precipitates were formed on the copper conductor at the exposed connection terminal portions in accordance with CAT-80 process of World Metal Co., in the following way.

(1) The copper conductor was brushed using abrasives containing alumina powder.

(2) After the abrasives were sufficiently washed off with water, the substrate was dipped in an aqueous solution containing 100 ml/l of a degreasing agent and 100 ml/l of HCl at 70° C. for 2 minutes for degreasing and cleaning.

(3) After the substrate was washed with water, it was dipped into an aqueous solution containing 200 g/l of $(NH_4)_2S_2O_8$ and 2 g/l of $H_2SO_4$ at 40° C. for 1 minute for soft etching.

(4) After being washed with water, the substrate was dipped into a 98% $H_2SO_4$ in 100 g/l at 25° C. for 1 minute.

(5) After being washed with water and with pure water, the substrate was dipped into an alkaline aqueous solution containing palladium in a concentration of 170 to 180 ppm at 60° C. for 1 minute while the solution was being stirred, so that the palladium nuclei were formed on the copper conductor surface, that is, non-electrolytic plating of the palladium nuclei was effected so as to activate the copper conductor surface.

(6) After being washed with water, the substrate was dipped into 36% HCl of 300 ml/l at room temperature for 30 minutes for acid washing.

(7) After being washed with water and then with pure water, the substrate was dipped into "Combus Pro" (trade name of World Metal Co.) containing 94 to 96% of Co and 4 to 6% of P at 85° C. for 60 minutes while the solution was being stirred and non-electrolytic plating was conducted at a plating rate of 10 μm/hour in a Co system multi-element alloy bath containing Co, P and others.

(8) After being washed sufficiently with water, the substrate was dipped into an aqueous solution of gold potassium cyanide of 2 g/l at a plating temperature of 85° C. for 5 minutes with stirring so that substitution type (catalyst type) thin non-electrolytic gold plating was made to cover the surface in a thickness of a few thousands of angstroms and to improve adhesion.

(9) After being washed with pure water, the substrate was dipped into self-catalyst type (containing a reducing agent of a self-decomposition type) non-electrolytic gold plating solution containing a complexing agent, 20 g/l of a reducing agent and 2 g/l gold potassium cyanide with stirring under an alkaline condition at 78° C. for 10 minutes to make thick non-electrolytic gold plating in a plating thickness of 0.5 μm and a purity of 99.99%. In this manner, the contact resistance was reduced simultaneously with rust-proofing and fixability of the metal nodules were improved.

Thereafter, a hot melt type adhesive ("Chemit", a product of Toray Co., thickness 30 μm) was worked in a necessary shape and fixed tentatively on the connection terminal portions. After it was located to the circuit portion of a glass substrate equipped with ITO as the counter-part of connection, their connection surfaces were arranged to face each other and thermal bonding was made at 200° C. and a pressure of 40 to 60 kgf/cm² for 10 to 20 seconds by use of a thermal bonding apparatus (a product of Japan Avionix Co.).

Figure 14:
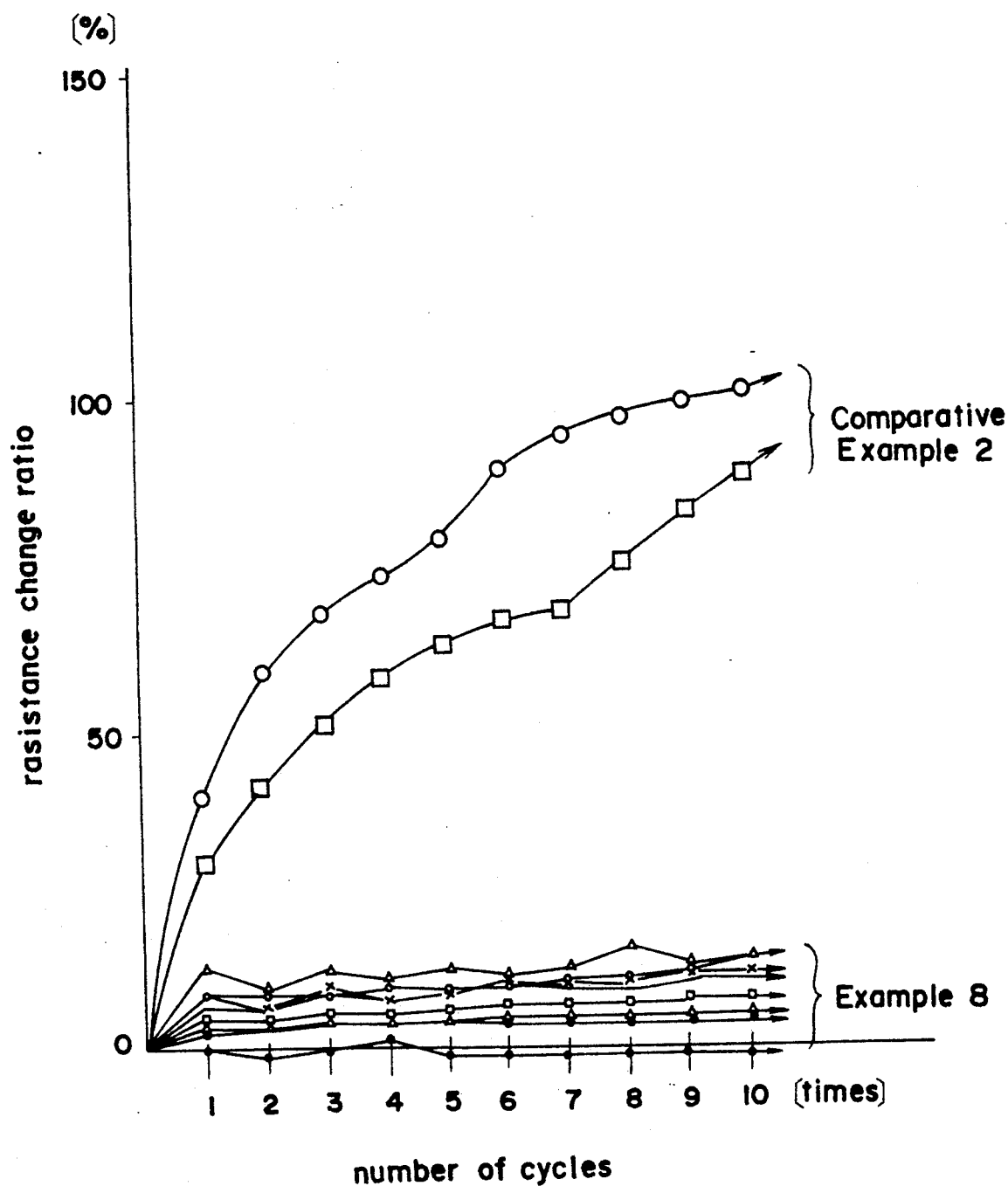
FIG. 14 is a diagram showing the results of thermal cycle tests of the printed wiring board obtained in Example 8.
Figure 15:
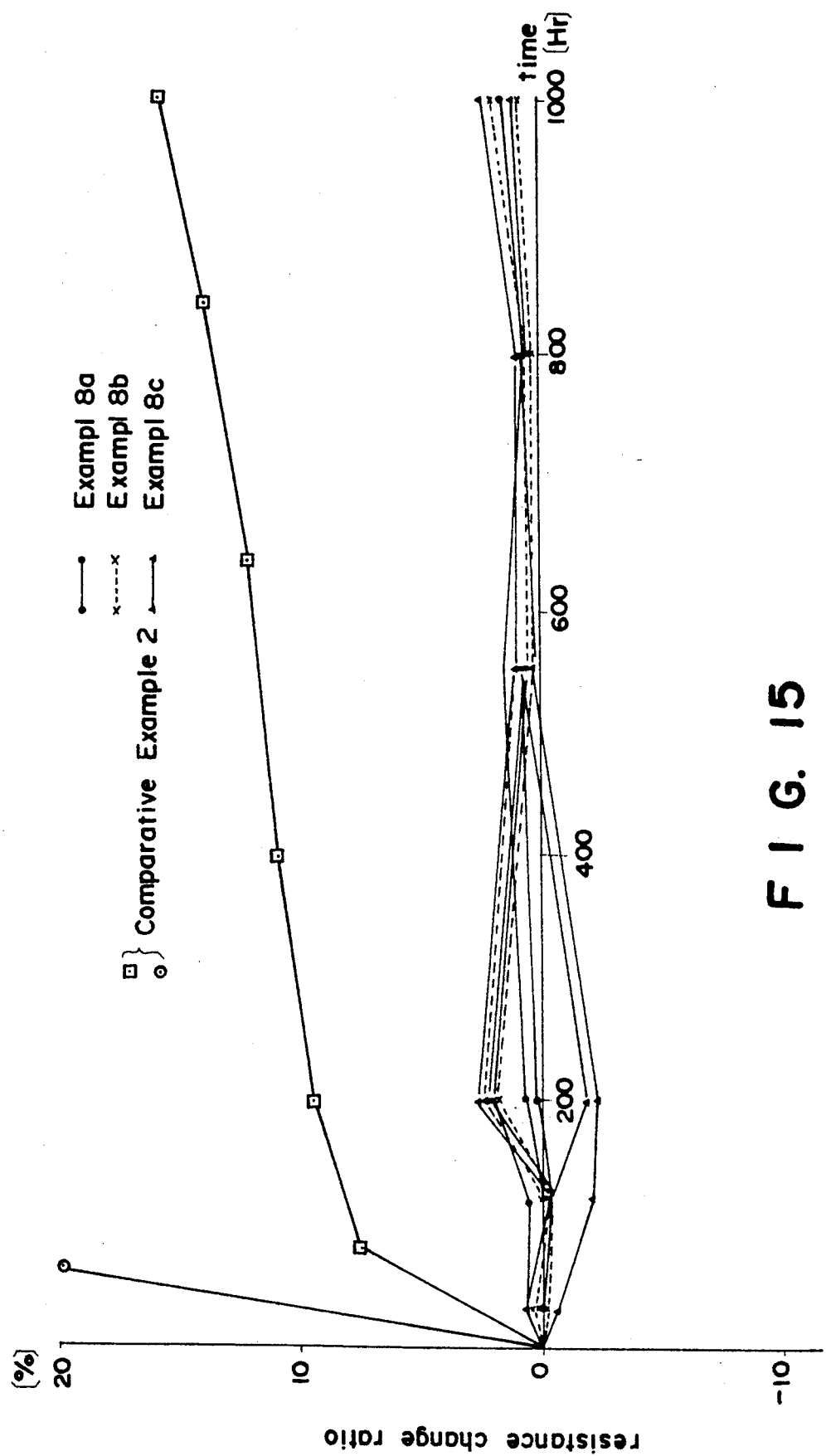
FIG. 15 is a diagram showing the results of high temperature high humidity tests of the printed wiring board obtained in Example 8.

Next, the connection resistance, the insulation resistance between wires and bonding power of the sample thus connected were measured and a thermal cycle test (thermal impact test) and a high temperature high moisture test were carried out. The results are shown in Table 4 in comparison with the case of the conventional anisotropic conductor film (Comparative Example 2). The result of the thermal cycle test till 10 cycles is shown in FIG. 14 and the results of the high temperature high humidity test (as Examples 8a, 8b and 8c depending on the kinds of adhesives used) are shown in FIG. 15 in comparison with the case of the conventional anisotropic conductor film (Comparative Example 2), respectively.

TABLE 4

| | Example 8 | Comparative Example 2 |
|---|---|---|
| connection resistance | $10^{-4}$–$10^{-5}\Omega$ | 0.5–40Ω |
| insulation resistance between wires | $10^{10}$–$10^{12}\Omega$ | 10–$10^8\Omega$ |
| bonding power (peel strength) | 1 kgf/cm or above | 0.5 kgf/cm |
| thermal cycle test* | 20% or below | 100% or above |
| high temperature high humidity test** | up to 5% | 27% or above |

*Thermal cycle test: resistance rise ratio (%) after 100 cycles each consisting of −40° C. and 100° C. for 80 minutes each.
**High temperature high humidity test: resistance rise ratio (%) after 1,000 hours at 60° C. and a humidity of 90%.

In this example the counter-part substrate of the connection was the glass electrode equipped with ITO but it is also possible to use the metal nodules formed on PCB (rigid substrate) as the counterpart electrode in the same way as in this example.

EXAMPLE 9

Figure 16:
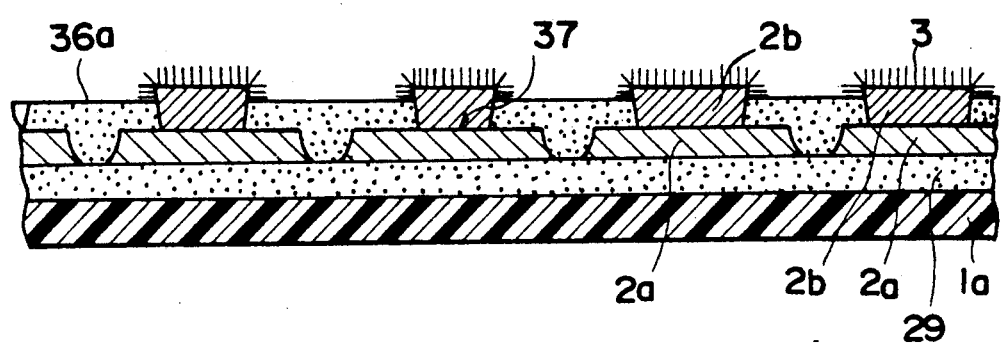
FIG. 16 is a sectional view showing schematically part of the connection terminal portions of the printed wiring board produced in Example 9.

First of all, a flexible printed board (250 mm × 330 mm) was prepared which was formed by laminating an 18 μm-thick copper foil 2a on an about 25 μm-thick polyimide film 1a through an adhesive 29 as shown in FIG. 16. After the copper surface was cleaned, a liquid photoresist was coated and exposure was made through a negative film pattern having conductor wires of 6 wires/mm (conductor width 137 μm) and development was then made. Thereafter the copper layer was etched in the same way as in Example 8 and the resist was peeled to obtain a printed wiring board having a small conductor gap (30 μm).

Next, a permanent resist type photosensitive dry film 36a was laminated on the entire surface of the printed wiring board having formed thereon this circuit, and exposure and development were again made using a mask which allowed to form 50 μm-square windows 37 on the conductor at the connection terminal portion. At this stage the 50 μm-square window 37 was formed at the center of each of the 137 μm-wide copper conductor 2a and the conductor was exposed only at this portion with the other portions being coated with the resist.

Next, non-electrolytic plating was made onto the exposed copper conductor (50 μm square) by a non-electrolytic process. This process was the same as that used in Example 8 except that high speed non-electrolytic nickel plating (plating rate=20 μm/hour) was made for 90 minutes to form the conductor 2b after the activation by palladium non-electrolytic plating explained in Example 8.

In this manner, the metal nodules 3 formed at the 50 μm-square portions of the conductor at the connection terminal portions were uniform and moreover, short-circuit did not at all occur between the conductors even though the gap was 30 μm.

The printed wiring board formed in the manner described above and the glass electrode equipped with ITO were connected on the same way as in Example 8.

EXAMPLE 10

Figure 17:
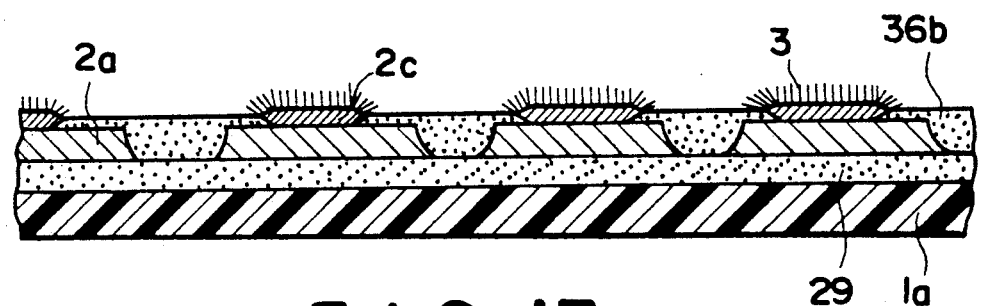
FIG. 17 is a sectional view showing schematically part of the connection terminal portions of the printed wiring board produced in Example 10.
Figure 18:
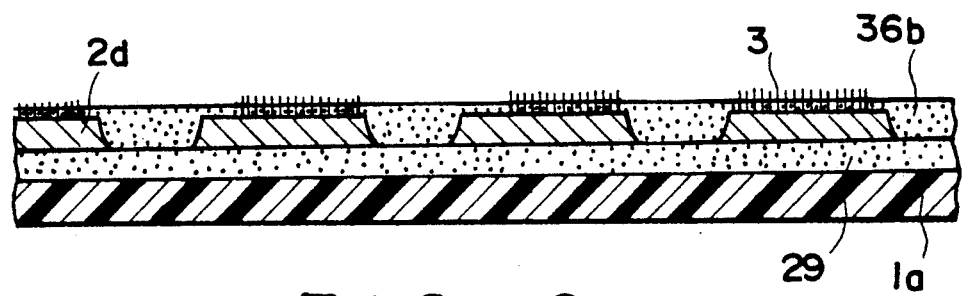
FIG. 18 is a sectional view showing schematically part of the connection terminal portion of the printed wiring board produced in Example 11.

A printed wiring board having formed thereon the metal nodules 3 was obtained in the same way as in Example 9 except that a photosensitive epoxy resin 36b was used as a permanent resist as shown in FIG. 17.

In this case, since the liquid resin could be coated in a thickness as small as about 5 to 10 μm, the copper conductor 2c might be formed by use of high speed non-electrolytic plating (3 to 5 μm/hour) as the non-electrolytic plating for burying the window portions used in Example 9.

EXAMPLE 11

A printed wiring board having formed thereon the metal nodules 3 was obtained in the same way as in Example 9 except that the conductor 2d was formed by the same non-electrolytic plating which was the same as the one used burying the windows and for forming the metal nodules.

What is claimed is:

1. A mounting substrate comprising a substrate having formed thereon a conductor circuit, components connected electrically to said circuit and mounted onto said substrate, wherein each electrical connection portion of said circuit has a large number of metal nodules formed on said conductor by plating thereon, the nodules-formed connection portions and the mating connection portions of said components are fixed by an adhesive provided therebetween, whereby said circuit and said components are mechanically connected to each other and electrically connected to one another via the nodules.

2. The mounting substrate according to claim 1 wherein said metal nodules are dendrites formed by electrodeposition.

3. The mounting substrate according to claim 1 wherein said metal nodules are needle-like precipitates formed by non-electrolytic plating.

4. The mounting substrate according to claim 1, wherein said adhesive covers said circuit of said substrate and functions also as a coating which protects the circuit pattern.

5. The mounting substrate according to claim 1, wherein said adhesive is a film-like laminated adhesive.

6. The mounting substrate according to claim 1, wherein said adhesive covers as a whole said circuit of said substrate.

7. The mounting substrate according to claim 1, wherein said metal nodules are formed only at said connected portions of said circuit, and predetermined portions other than said connection portions have a coating thereon.

8. The mounting substrate according to claim 7, wherein said components include an IC chip.

9. A printed wiring board comprising at least one connection terminal portion to be connected to at least one printed circuit board and having an electrical connector function, said connection terminal portion having a conductor, a large number of metal nodules formed by plating on each of the conductor surfaces of said at least one connection terminal portion.

10. The printed wiring board having a connector function according to claim 9, wherein said metal nodules are dendrites formed by electrodeposition.

11. The printed wiring board having a connector function according to claim 9, wherein said metal nodules are needle-like precipitates formed by non-electrolytic plating.

12. The printed wiring board having a connector function according to claim 9, wherein an adhesive is coated on the nodules-formed conductor surfaces.

13. The printed wiring board having a connector function according to claim 10, wherein an insulation layer which prevents formation of metal nodules on the side surfaces of the conductors of said at least one connection terminal portion is disposed between adjacent conductors of said connection terminal portion.

14. A printed wiring board having a connection function according to claim 9, wherein said printed wiring board is a single surface printed wiring board.

15. A printed wiring board having a connection function according to claim 9, wherein said printed wiring board is a double surface printed wiring board.

* * * * *